Figure 1:
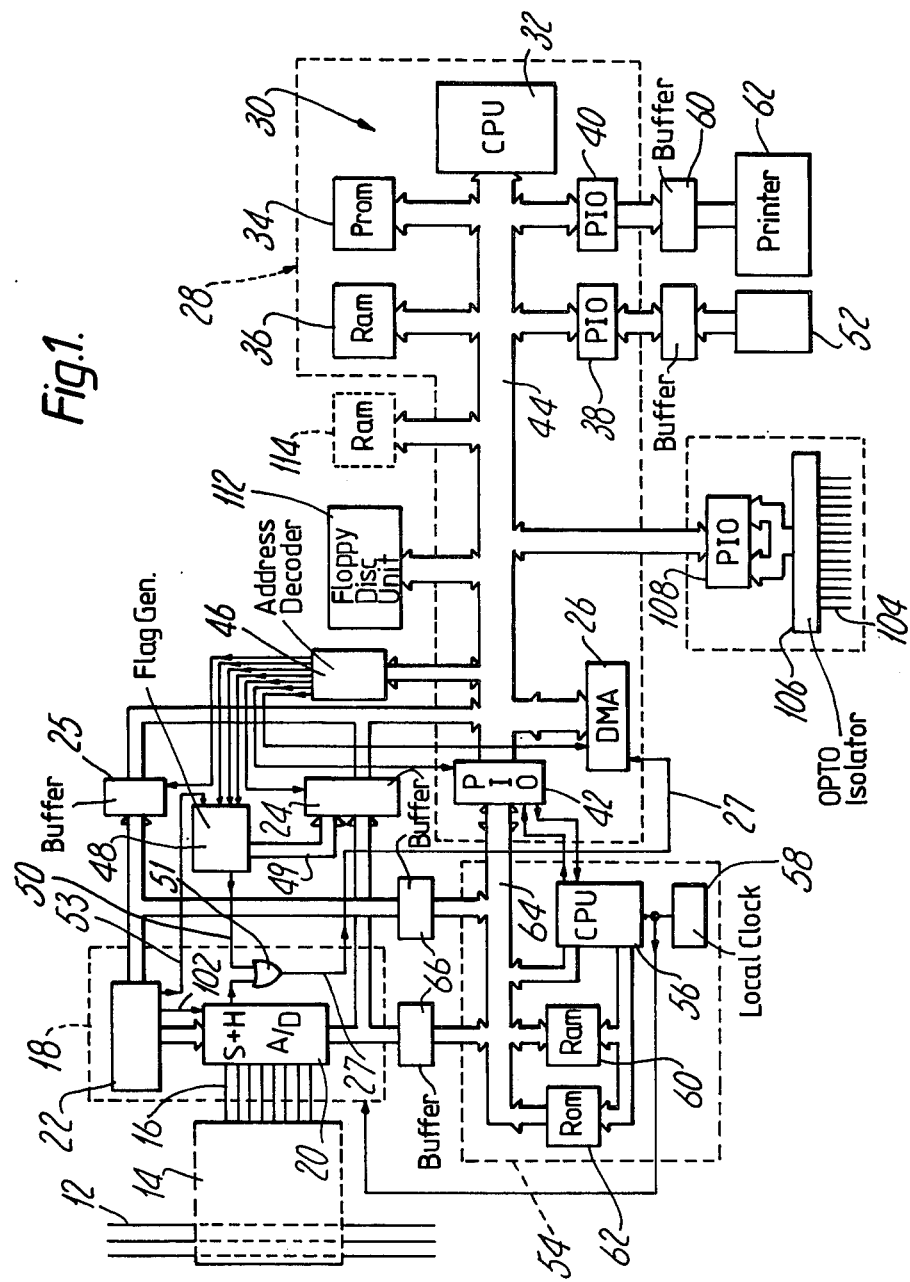

United States Patent [19]

Bagnall et al.

[11] Patent Number: 4,484,290
[45] Date of Patent: Nov. 20, 1984

[54] LINE DISTURBANCE MONITOR

[75] Inventors: Jeffrey L. Bagnall, Eccles; Tom Roscoe, Oldham, both of England

[73] Assignee: Ferranti plc, Cheshire, England

[21] Appl. No.: 359,313

[22] Filed: Mar. 18, 1982

[30] Foreign Application Priority Data

Mar. 28, 1981 [GB] United Kingdom ................. 8109809

[51] Int. Cl.³ ............................................ G01R 19/00
[52] U.S. Cl. .................................... 364/483; 340/518; 340/538
[58] Field of Search ............... 364/480, 481, 483, 492; 340/518, 538

[56] References Cited

U.S. PATENT DOCUMENTS

| | | | |
|---|---|---|---|
| 3,629,852 | 12/1971 | Thexton et al. | 364/900 |
| 3,795,861 | 3/1974 | Lazenby et al. | 324/102 |
| 3,813,667 | 5/1974 | Smith | 340/521 |
| 3,846,698 | 11/1974 | Lawton | 324/102 |
| 3,972,470 | 8/1976 | Takagi | 364/492 |
| 4,156,280 | 5/1979 | Griess | 364/481 |
| 4,291,355 | 9/1981 | Dinger | 364/492 |
| 4,328,551 | 5/1982 | Yamaura et al. | 364/492 |
| 4,371,947 | 2/1983 | Fujisawa | 364/483 |

OTHER PUBLICATIONS

Power Line Disturbance Monitor/Model 3500, Specification Brochure, Franklin Electric Company.

Primary Examiner—Errol A. Krass
Assistant Examiner—Clifford L. Tager
Attorney, Agent, or Firm—Kerkam, Stowell, Kondracki & Clarke

[57] ABSTRACT

A monitor (FIG. 1) of disturbances of normal voltage/current parameters of a power line 12 consists of input A/D conversion means 18 by which the actual parameters are sampled and digitized and applied to a store 36 controlled by a main microprocessor 30. A real time clock also provides time markers which are stored as flags with the sample data. The store has a plurality of locations which are addressed in a loop whereby newly digitized sample data replaces that stored previously. A secondary microprocessor 54 also receives the digitized measured parameter data which it compares with stored nominal parameter data to detect a disturbance, the detection causing the store to store subsequent sample data sequentially in different locations. Thereafter the main processor reads the data from the store to provide samples stored prior to, and subsequent to, the disturbance and the real time relationship between them. The data read from the store is reproduced on a dot-matrix printer 62 in graphical form related to the real time markers and the information relating to the disturbance printed alphanumerically to a higher degree of accuracy than the printer resolution permits. The data may be stored on a removable floppy disc 112 for reproduction on a high resolution plotter and external event inputs 104 may be provided to cater for a limited number of bistable condition changes considered as disturbances.

17 Claims, 3 Drawing Figures

LINE DISTURBANCE MONITOR

This invention relates to monitoring of disturbances in the operating parameters of power lines and in particular to the detection and subsequent recording of such disturbances.

Disturbance detectors are known in which various operating parameters of a power line, for instance peak voltage/current and rate of change of voltage, are compared with preset parameters and give an output signal if the measured parameters depart from those preset by more than a predetermined amount, an occurrence hereinafter referred to as a "deviation". Such detectors have been used with disturbance recorders in which analog representations of the parameters of interest are recorded and displayed. Known disturbance recorders comprise electromechanical devices in which the measured line parameters are continuously written by pen recorders onto a sensitized drum and overwritten for each drum revolution. A permanent record medium is arranged to be brought into contact with the drum at a location peripherally spaced from the writing area so that the trace is transferred and a record formed. The record medium is normally clear of the drum until a disturbance is detected whence contact is effected, the delay caused by motion of the drum to between the writing and contact locations enabling a portion of the pre-disturbance trace to be recorded with the post-disturbance trace.

Whereas such a combination of devices has been satisfactory the electromechanical nature of the arrangement results in a bulky piece of apparatus which requires a considerable degree of maintainance to ensure that the continuously working device responds successfully to record a disturbance. Furthermore the reproduction of a pen-recorded analog waveform trace is all that can be expected of such a device and considerable judgement is required on the part of an operator to interpret the results.

It is an object of the present invention to provide a disturbance monitor, that is, an instrument which both detects and records disturbances, of the operating parameters of a power line which mitigates at least some of the disadvantages and limitations imposed by known types.

According to one aspect of the present invention a disturbance monitor for monitoring at least one operating parameter of a power line comprises input means operable to provide from the power line analog signals representative of the time varying value of each parameter, A/D conversion means operable to sample the analog signals at predetermined intervals and produce at each sample time a digital sample word representing the value of the, or each, parameter at the sample time, disturbance sensing means responsive to a deviation of a digital sample word from stored reference parameter values to derive data indicative of a disturbance on the line, storage means including at least one storage zone having a plurality of storage locations of which a predetermned number are assigned to pre-disturbance operation, being arranged for sequential addressing in a loop to store sequentially generated sample words with the most recently generated word replacing the oldest stored word, and the remainder assigned to post-disturbance operation, being arranged to store sample words sequentially addressed, and control means operable to write the sample words derived from the analog signals into the pre-disturbance storage locations as the words are generated and responsive to the disturbance sensing means to write subsequently generated sample words into the post-disturbance locations, said control means being arranged thereafter to read the sample words from the storage means in chronological order of storage and prepare said sample words for display of the corresponding signals in analog form.

The monitor means may include display means comprising a printer of the dot-matrix type, that is one in which alphanumeric characters are composed of dot-like elements, visibily marked onto a record medium, the control means being operable to translate each sample word, read from the storage means, into a position on the printer format related to the magnitude of the sample value and to provide an instruction to the printer to print a mark at that position.

The printer may also be caused to print information relating to the disturbance in alphanumeric form.

The control means may comprise a (main) processor arrangement programmed to receive disturbance detection data from the disturbance means to control the operating mode of the storage means and the preparation of display data from the stored data.

The disturbance means may comprise a (secondary) processor arrangement connected to the main processor arrangement by way of a system bus along which the parameter and disturbance detection data is passed and by way of buffering means to the A/D conversion means to receive sample words directly therefrom as they are formed.

According to another aspect of the present invention a method of monitoring a power line for deviation of a line parameter from a reference operating parameter comprises deriving from the power line an analog signal representative of the value of the parameter, digitising the signal by sampling to form a sample word which represents the value of the parameter at the time of sampling, storing a predetermined number of the sample words and a predetermined number of sample times in locations of a store arranged in a loop such that each generated sample word replaces the oldest stored word, comparing each sample word with words representing the reference values of the parameter and in response to detection of a disturbance by a deviation therefrom storing a succeeding predetermined number of generated sample words in different locations in the store, subsequently reading the stored sample words from the sote in chronological order of storage, and displaying representations of the sample values as a function of position with respect to one axis of the display against sample times as a function of the other axis of the display relative to the time at which the disturbance is detected.

Figure 2:
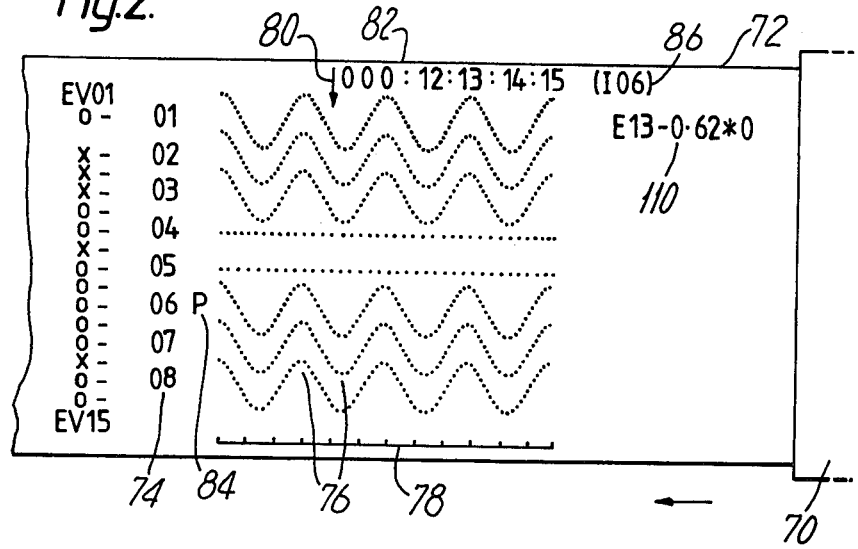
Figure 3:
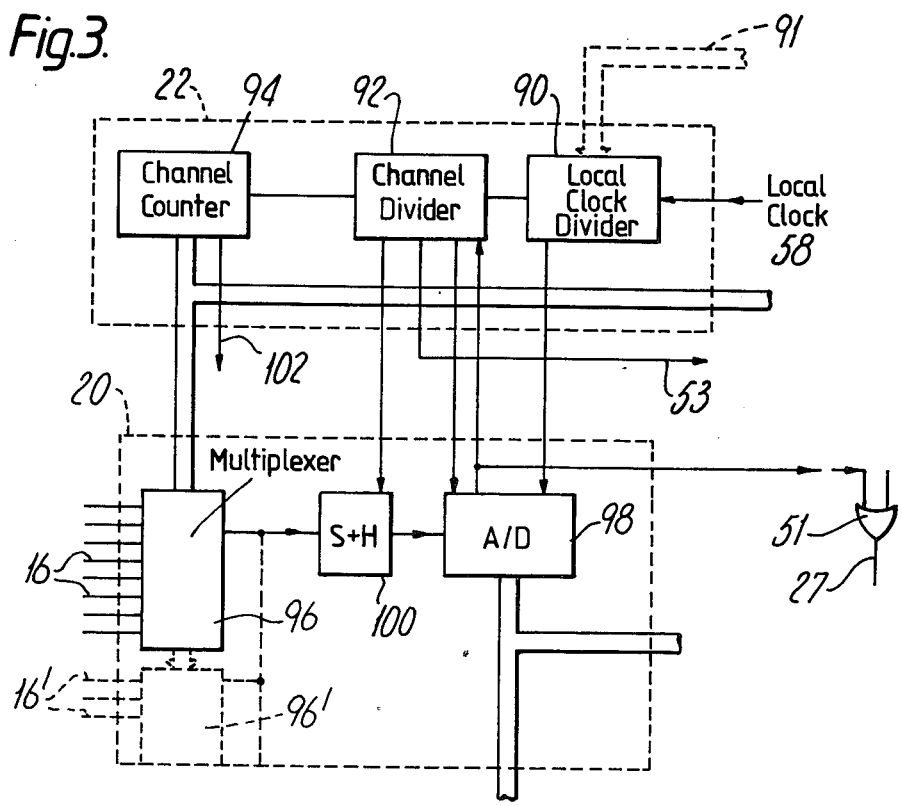

An embodiment of the invention will now be described by way of example with reference to the accompanying drawings, in which:

FIG. 1 is a schematic diagram of the disturbance monitor according to the present invention, FIG. 2 is an example of the form taken by a printed record made by the disturbance monitor according to the present invention, and FIG. 3 is a more detailed block diagram of the A/D conversion means of the disturbance monitor of FIG. 1.

Referring to FIG. 1, the disturbance monitor shown therein is intended for monitoring the operating parameters of power-transmission lines and to this end a plurality of power lines 12 are taken by way of input means 14 wherein an arrangement of voltage transformers and current transformers produce electrically isolated analog representations of the time varying values of the line parameters at levels suitably scaled for electronic circuitry.

In the embodiment described there are eight such input channels (which may represent voltage and current from four power lines or voltage or current from eight lines, or any combination from an intermediate number) which provide eight analog signals on lines 16 to A/D conversion means 18. The precise form taken by this input means is not important to an understanding of the invention and will not be described further. The A/D conversion means 18 which is described in greater detail hereinafter comprises an analog multiplexer and A/D converter 20 which operate under the control of a multiplexer address means 22 to scan the inputs 16 in sequence and sample the signal on each one forming a digital word corresponding to the magnitude of the sample taken. The multiplexer address means also produces identification data as a function of the input being scanned. The sample data and identification data hereinafter also referred to collectively as sample words are buffered by buffer means 24 and 25 respectively and applied to a direct memory access (DMA) device 26 forming part of control means 28.

The control means 28 comprises a main (micro)-processor arrangement 30 which is a microprocessor consisting of a CPU 32, programmable ROM 34 and RAM 36 a plurality of programmed input/output (PIO) devices 38,40,42, interfacing with the processor system bus 44, address decoder 46, data flag insertion means 48 and the DMA 26, giving direct access to the RAM 36 by way of the system bus without requiring processor capacity. The DMA 26 is responsive to a signal from the A/D converter on line 27 signifying completion of digitization of each sample to interrupt the main processor in execution of its program and in response to an address by the processor, decoded in decoder 46, to transfer the sample data as sample words from the buffers 24, 25, as each byte of data is available. The involvement of the CPU 32 is thus limited to exchanging instructions with the DMA device and not handling data.

The monitor includes storage means of the sample data, in the form of part of the RAM 36 of the main processor, into which the sample words are written directly by the DMA as each is formed. The RAM is arranged to have at least five storage zones for the digital data, each zone having the capacity to receive and store the data for the eight scanned input channels. For each input channel a block of a predetermined number of storage locations is assigned to pre-disturbance operation and the sample words are then sequentially written into these locations in a loop whereby the most recently generated word replaces the oldest stored word. The remaining storage locations associated with the input channel are assigned to post-disturbance operation and the sample words are sequentially written, as generated, into these locations until the zone is filled. The amount of store required depends upon the sampling rate but is chosen to record the samples generated over a continuous pre- and post-disturbance period of about 250 milliseconds.

The data flag generating means 48 contains means for generating four predetermined valued words, or flags, having unique values characteristics of said flag identities. The A/D arrangement also contains logical means (not shown) to ensure that no sample words are produced which have the values assigned to the flags so that there can be no confusion as to the occurrence of a flag. Furthermore the timing of generation of sample words and flags is arranged under the control of multiplexer address means 22 such that flags are generated only in intervals between sample words.

As stated above there are four flags which can be generated in accordance with instructions from the main processor decoded by decoder 46. The significance of the flags are passed by data path 49 to the buffer 24. The flag generating means also produces a 'flag ready' signal on line 50 and OR gate 51 and line 27 to DMA 26.

The main processor is also arranged to act as a real time clock, being set initially manually by setting switch means 52 which the CPU scans by P10 38 to store this and other input data in from 34.

During digitization of the analog signals and storage of the samples taken the main processor issues signals to the flag generating means at 10 millisecond intervals and timing flags are inserted into the sample word stream and recorded with the samples by way of the DMA 26.

Also as the input channels 16 are scanned a synchronization flag is inserted by a signal 53 from multiplexer address means 22 to the flag generating means 48 prior to the selection of the first channel for sampling. This enables the main processor to relate the multiplexed samples to the correct input channel.

Whereas the writing into store of sample data and timing flags is performed by the DMA 26, the CPU 32 controls the operation of the store, that is, change of storage procedure and the allocation of a fresh zone when one is full. This change in storage procedure is consequent upon a disturbance and data provided by disturbance sensing means 54.

The disturbance sensing means comprises a secondary microprocessor arrangement consisting of a CPU 56, under the control of a local clock 58, RAM 60 and ROM 62. These elements are linked by a data bus 64 which is coupled to the system bus 44 by way of PIO 42 and by way of buffers 66 to the A/D converter 20 and multiplexer address means 22 to receive sample data directly. The RAM 60 stores the optimal operating parameters of the power line, which parameters are updated periodically by the control means which stores the parameters in the non-volatile memory of the PROM 34. The parameters are written into the PROM 34 by setting parameter switches on setting switch means 52 which the CPU 32 scans by PIO 38 to store the appropriate data. The detection of a deviation in line parameters by the secondary processor 54 results in communication of the cause of the deviation to the main processor by way of the PIO 42 bus so that the storage procedure for the RAM 36 can be changed to the post-disturbance mode. If desired the secondary processor may be programmed to calculate the magnitude of the disturbance which is also communicated to the main processor. The main processor instructs the PIO 42 to pass data relating to the nature of the disturbance to the main processor which stores the information. Also the main processor instructs the flag generating means to insert a disturbance flag into the sample word stream indicative of the occurrence of a disturbance. As stated above when one of the storage zones is filled, as a result of the detection of a disturbance, the processor allocates a different zone to receive subsequent sample words into a looped storage block until detection of a further disturbance.

It will be appreciated from the above that the continual transfer and storage of sample words and the examination of each sample word, as it is formed, for deviation from stored parameters is detected with little demand on the main CPU 32.

Thus upon filling of a storage zone as a result of a disturbance the main processor is able to read the sample words in chronological order of storage, so as to have a representation of the values and storage times of pre- and post-disturbance samples and of the time and nature of disturbance.

The output of the main processor is by way of PIO 40 which is connected by way of a buffer 68 to a dot-matrix printer 70. The first microprocessor is programmed to translate each sample word into a position with respect to a printer format (a displacement from an axis) which represents the analog value of the parameter and at which the printer is caused to print a dot. Timing flags which occur between sample words are caused to print markers on the axis so that the printer is able to produce a graphical record in its own time of the analog values of the eight channels as a function of the time markers representing the real time of sampling. As an example an electro-sensitive dot-matrix printer of English Numbering Machines Ltd. model ESP40 prints a graphical representation of a 250 millisecond disturbance record in a time of about 55 seconds. The disturbance flag when retrieved from the store causes the main processor to instruct the printer to print a marker characteristic of the disturbance occurrence which shows the time of occurrence with respect to the graphical record.

The use of a printer to display the relevant sections of waveform enables alphanumeric data to be printed onto the display both as an aid to interpretation and as additional information. For instance, the recording operation of the system is arranged to take place in real-time and the system clock is set accordingly. Consequently, on print out of the display the real time of the disturbance may also be printed out alphanumerically to any degree of accuracy required, in this case the nearest 0.01 second and the channel upon which the disturbance was detected. The channels may also be given alphanumeric identifications to aid interpretation and the actual parameter violated indicated by a suitable code character (such as 'M' for peak value not reached, 'P' for peak value exceeded and 'R' for rate of change exceeded).

FIG. 2 shows an example of such a format on a print out 72 which moves to the left on emanating from a printer 70. The analog input channels are designated 01-08, (at 74), and the analog signals, reconstituted from the digital sample words, plotted out at 76 with the recorded time markers defining 0.01 second intervals at 78. The instant at which the disturbance occurred in relation to said analog signals is indicated by an arrow marker 80. The waveforms to the left of the arrow thus indicate pre-disturbance conditions and the waveforms to the right indicate the post-disturbance conditions. The real time of occurrence of the disturbance is printed alphanumerically alongside the arrow, as shown at 82 as a measure of days: hours: minutes: seconds and hundredths of seconds from when the monitor was originally calibrated 82. The violated parameter code character (P) is printed as shown at 84 alongside the channel identification (06). As a further aid to interpretation the channel identification is also shown at 86 bracketed after the time information.

Referring now to FIG. 3, A/D conversion means is shown in greater detail. The multiplexer address means 22 comprises a clock divider 90 connected to receive clock pulses from the local clock 58. The reduced rate clock pulses are further divided by a channel divider 92 in accordance with the number of input channels and employed to increment a channel counter 94. The analog multiplexer and A/D converter 20 are shown as separate components 96, 98 respectively. The analog multiplexer receives the eight input lines 16 and scans each one in turn under the control of channel counter 94. The signal on each scanned input is fed to a sample and hold circuit 100 and then to the A/D converter 98. The sample and hold circuit 100 and A/D converter both operate under the control of channel divider 92 and as each sample is digitized the A/D converter signals to DMA 26 by way of OR gate 51 and line 27 for the sample to be stored and to the channel divider whereby the sample and hold circuit and A/D converter are reset.

Each time the channel divider completes one scanning cycle it provides an output of a line 53 to the flag generating means 48 whereby a synchronization flag is inserted before a sample word derived from the first channel, as described above, to ensure identification of signals retrieved from the storage means with the correct channel. Furthermore this output controls the output of flags from the generating means 48.

The channel counter 94 also provides an output on line 102 to control the disturbance sensing routine of second processor 54. If the sampling rate of the inputs for digitization and storage is high the disturbance sensing may be operated less frequently, say every third input channel scanned, such that comparison of samples for disturbance sensing is spread over three scans of the multiplexer inputs.

One or more multiplexers 96' may be employed with the multiplexer 96 to accept further input channels 16' in which case the operation rate of the processor 56 is suitably selected.

The local clock divider 90 may have an input 91 connected to the system bus 44 whereby the clock division is set, and therefore variable, by the main processor such that changes of sampling rate may be introduced by programming of the main processor and not by hardware changes.

The use of digital recording and display in graphical and alphanumeric form enables the monitor to be used as a recorder of externally detected/monitored conditions or events associated with the lines being monitored, as well as internally detected disturbances described above.

For instance the disturbance monitor may be associated with a switching station in which the power line includes contacts which may be either open or closed. Furthermore, said switching station may be caused to trip as a result of a disturbance on the line which could lead to the contacts changing state temporarily or permanently.

The monitor may be provided with an 'event' input means accepting switch contact state inputs on lines 104 from external transducers (not shown). The event input means includes opto-isolating means 106 to protect the monitor from any harmful surges and PIO means 108 connected to the system bus 44 by way of which the lines can be scanned by the main processor and the condition thereof stored in the RAM 36, time related to the sample signals.

The change of state of one of the inputs is taken by the main processor as a disturbance (if it occurs without one being sensed by the disturbance sensing means 54) and the post-disturbance procedure entered. The condition of the event inputs before the disturbance can be printed out as a table (E01–E15, FIG. 2 in which the symbol x indicates a closed contact and O an open contact) and any event changes, whether the cause of a disturbance or consequential upon one, listed alphanumerically as at 110. Such consequential 'events' may be recorded in terms of the occurrence times and contact status at the end of recorded period. It will be appreciated that the information to be stored in respect of the event input means is very small compared to that from the analog input means, representing only states and changes of states. Given that such consequential events may occur for some time after the disturbance they may be recorded for relatively long periods of several seconds compared with the analog input storage time of about 250 milliseconds. Any events occurring within the time of the graphical display of the analog inputs may also be displayed graphically (by full or broken line) superimposed upon the analog waveforms as a result of an event flag inserted into the sample data stream by the generating means 48 upon acknowledgement of an event input disturbance by the main processor.

Whereas the use of a printer makes possible the display of both graphical and alphanumeric information to the best advantage it will be appreciated that the printing format for the graphical representation limits the resolution available, although alphanumeric representations of the data of interest can be given with the requisite accuracy for most purposes.

However, if it is required to make more detailed displays the stored data may also be recorded in a removable form, such as on a magnetic floppy disc in unit 70. Such a disc could be removed periodically or if disturbance of particular interest occurred and reproduced on a higher resolution printer, or the analog signals on a pen recorder or on a CRT visual display unit.

In the above description the generation and insertion of four different flags into the stored sample data has been considered, and the precautions taken to avoid conflict between flags and sample words outlined. In order to resolve any conflicts between the generation of flags they may be assigned an order of priority. The highest priority is given to the synchronisation flags which ensure the stored signals are attributed to the correct input channel. Second priority is given to the event flag, third priority to the timing flags and lowest to the disturbance flag.

As described above, the RAM 36 which contains the working store of the main processor is also used for the purpose of storing the sample words. Also mentioned was the fact that the memory has five zones available for the storage of sample data. This is to provide the ability to monitor completely a 'worst case' disturbance situation in which a fault condition on the line is detected as a first disturbance causing the line switch contacts to open, followed sometime later by automatic reclosure of the switch contacts. This closure 'event' is detected as a second disturbance, followed by detection of the sustained fault condition as a third disturbance (with resultant opening of switch contacts). Automatic re-closure of the switch contacts is detected as a fourth disturbance and detection of the sustained fault condition as a fifth disturbance (with resultant opening of switch contacts). After such a sequence of two automatic reclosures the automatic switchgear control 'acknowledges' the presence of a fault and the line remains open until the fault is rectified. Thus in such a situation the monitor requires to handle five disturbances in rapid succession to provide a complete record of activity. Clearly the storage means may be provided with a greater or lesser number of zones as considered appropriate.

As stated previously the number of storage locations in each zone required depends on the sampling rate, the length of time for which each disturbance is recorded the sampling bandwidth and the number of channels.

As an example, an 8-channel monitor operating on a bandwidth of 600 Hz recording five consecutive faults of 250 milliseconds each requires 16 Kbytes of store space while an 8-channel, five-fault monitor operating at a bandwidth of 1.8 KHz would require 48 Kbytes store space. A 16 channel five-fault monitor operating with a bandwidth of 600 Hz would require 32 Kbytes of store while the equivalent at 1.2 KHz bandwidth requires 64 Kbytes of store. The lower sampling rates are those which match the resolution expected of the printer and may be satisfactory if this is to comprise the only form of output. It will be appreciated that other forms of output, such as a CRT display unit could be employed, giving higher resolutions, with a photographic facility for making permanent records.

If the storage capacity required is greater than that provided by the standard RAM component of the microprocessor forming the main processor, additional storage can be provided by an additional RAM such as that shown as 114, coupled to the system bus 44. Furthermore if a permanent recording medium such as floppy disc unit 112 is employed to make detailed records of the stored data, part of the disc can be used to store data freeing the RAM for other functions but reading the data back to the RAM for retrieval and processing by the CPU 32.

It will be appreciated that the storage capacity can be increased easily to facilitate any number of sample words or input channels as the recording of sample words and scanning of analog inputs for disturbance takes place in real time with very little work on the part of the microprocessor which is free to read the stored information and present it in a form suitable for display at an arbitrary rate within the capacity of a simple processor.

While the above description has related to monitoring of power transmission lines it may be used to monitor local distribution lines or distribution lines within a building or piece of apparatus.

We claim:

1. A disturbance monitor for monitoring at least one operating parameter of a power line comprising:
  input means connectable to the power line for providing at least one analog signal representative of the time varying value of the parameter;
  A/D conversion means connected to said input means for sampling the analog signal at predetermined intervals and producing at each sample time a digital sample word representing the value of the sampled parameter at the sample time;
  disturbance sensing means connected to receive digital sample words from said A/D conversion means, said disturbance sensing means storing reference parameter values for the power line and to detect deviations from the reference parameter values by the received digital sample words and derive in response to such deviations data indicative of a disturbance on the line;

storage means including at least one storage zone having a plurality of storage locations of which a predetermined number are assigned to pre-disturbance operation, and the remainder are assigned to post-disturbance operation, said predetermined number of storage locations being arranged for sequential addressing in a loop to store sequentially generated sample words with the most recently generated sample word replacing the oldest stored sample word, and said remainder of said storage locations arranged to store sample words sequentially addressed;

control means including a main digital processing unit connected to receive sample words from said A/D conversion means and programmed to cause the sample words to be written into the pre-disturbance storage locations as the sample words are generated, and said control means being responsive to said disturbance sensing means to cause subsequently generated sample words to be written into the post-disturbance locations;

data flag generating means responsive to at least one predetermined operating condition and inserting data flags representing the predetermined condition into said storage means between successively generated sample words; and said control means, after said post-disturbance locations have been filled, reading the sample words and the data flags from the storage means in chronological order of storage and preparing said sample words for display of the corresponding signals in analog form, the data represented by the flags being chronologically related to said corresponding signals.

2. A disturbance monitor as claimed in claim 1 in which said main digital processing unit includes a real time clock and said data flag generating means inserting into the storage means data timing flags at predetermined intervals defined by the real-time clock whereby the sample words read from the storage means can be subsequently related to their real time of sampling.

3. A disturbance monitor as claimed in claim 1 in which said data flag generating means is responsive to detection of a disturbance by said disturbance means to provide a disturbance detection flag to the storage means characteristic of the disturbance such that sample words read from said storage means can be evaluated relative to the time of the disturbance.

4. A disturbance monitor as claimed in claim 1 having a plurality of input channels respectively corresponding to a plurality of power line operating parameters, said disturbance monitor including an analog multiplexer connected to said input means and scanning the input channels in sequence by successively applying the analog signals to said A/D conversion means, and said data flag generating means periodically inserting data synchronization flags into said storage means in synchronization with multiplexing of the input channels such that sample words subsequently read from the store are related to their corresponding input channels.

5. A disturbance monitor as claimed in claim 1 which further comprises a system bus connected to said main digital processing unit, and buffering means connected to an output of said A/D conversion means, and in which said disturbance sensing means comprises a secondary digital processing unit arrangement connected to said system bus for passing disturbance detection data to said main digital processing unit and connected to said buffering means to receive sample words as they are formed directly from said A/D conversion means, said secondary processing unit determining from the digital sample words the value of each operating parameter being monitored and by comparison with the reference parameter value providing an indication of a disturbance and the parameter deviation causing the disturbance.

6. A disturbance monitor as claimed in claim 5 in which said secondary processing unit receives the reference parameter data periodically from said main processing unit.

7. A disturbance monitor as claimed in claim 5 in which said disturbance sensing means is controlled by said A/D conversion means to receive the sample words as they are formed by said A/D conversion means.

8. A disturbance monitor as claimed in claim 5 in which the main and second processing units each have timing clocks asynchronous to each other and the input means and A/D conversion means are controlled by said timing clock of the second processing unit.

9. A disturbance monitor as claimed in claim 1 in which the storage means has a plurality of storage zones each having pre- and post-disturbance-assigned locations arranged such that the filling of the post-disturbance assigned locations of one storage zone causes subsequent sample words to be routed to the pre-disturbance assigned locations of another zone.

10. A disturbance monitor as claimed in claim 1 including display means comprising a dot-matrix printer, said control means translating each sample word read from the storage means into a position on the printer format related to the magnitude of the sample value and providing an instruction to said printer to print a mark at that position.

11. A disturbance monitor as claimed in claim 10 in which said control means is also operable to instruct said printer to print a predetermined marker in response to each data flag read from the storage means at a position characteristic of the flag.

12. A disturbance monitor as claimed in claim 11 in which said control means is operable also to instruct said printer to print information in alphanumeric form at a position on the printer format related to the disturbance.

13. A disturbance monitor as claimed in claim 1 including event input means operable to receive signals representing the states of bistable operating means and responsive to each change of state to produce a disturbance signal.

14. A method of monitoring a power line for deviation of an operating parameter from a reference, said method comprising:

deriving from the power line an analog signal representative of the parameter;

digitizing the signal by sampling to form a succession of sample words which represent values of the parameter at the times of sampling;

storing a predetermined number of the sample words and a predetermined number of sample times in locations of a store arranged in a loop such that each generated sample word replaces the oldest stored word;

comparing a function of the sample words which represents the function of the operating parameter with a function which represents the reference and, in response to a deviation therefrom indicative of a line disturbance, storing a succeeding predetermined number of generated sample words in different locations in the store;

subsequently reading the stored sample words from the store in chronological order of storage; and displaying representations of the sample values, as a function of position with respect to one axis of the display, against sample times as a function of position with respect to the other axis of the display relative to the time at which the disturbance is detected.

15. A method as claimed in claim 14 which includes displaying the representations of the sample values and sample times as marks on a printer print-out format, the position of the marks being derived from the values of the samples.

16. A method as claimed in claim 15 which includes causing the printer to display alphanumeric data relating to the stored sample words and the time of disturbance detection at positions on the printer format dependent upon the data.

17. A method as claimed in claim 16 including recording digitally the states of bistable apparatus associated with the power line and any change thereof which may cause or occur in response to a disturbance, and displaying alphanumerically at printer format positions indicative of the bistable apparatus the pre- and post-disturbance states and the time of change.

* * * * *